(12) United States Patent
Cranford, Jr. et al.

(10) Patent No.: US 7,477,713 B2
(45) Date of Patent: Jan. 13, 2009

(54) METHOD FOR PROVIDING AUTOMATIC ADAPTATION TO FREQUENCY OFFSETS IN HIGH SPEED SERIAL LINKS

(75) Inventors: Hayden C. Cranford, Jr., Cary, NC (US); Gareth John Nicholls, Brokenhurst (GB); Bobak Modaress-Razavi, Morrisville, NC (US); Vernon R. Norman, Cary, NC (US); Martin L. Schmatz, Rueschlikon (SE)

(73) Assignee: International Business Machines Corporation, Armonk, NY (US)

( * ) Notice: Subject to any disclaimer, the term of this patent is extended or adjusted under 35 U.S.C. 154(b) by 729 days.

(21) Appl. No.: 10/791,175

(22) Filed: Mar. 2, 2004

(65) Prior Publication Data
US 2005/0195863 A1    Sep. 8, 2005

(51) Int. Cl.
H04L 7/02 (2006.01)

(52) U.S. Cl. .................. 375/360; 375/146; 375/149; 375/150; 375/316; 375/340; 375/342; 375/343; 375/350; 375/354; 375/356

(58) Field of Classification Search ............ 375/354, 375/360, 356, 361, 371, 146, 149, 150, 316, 375/340, 342, 343, 350
See application file for complete search history.

(56) References Cited

U.S. PATENT DOCUMENTS

| | | | |
|---|---|---|---|
| 4,028,626 A | 6/1977 | Motley et al. | |
| 4,536,718 A * | 8/1985 | Underhill | 331/16 |
| 4,599,732 A | 7/1986 | LeFever | |
| 5,125,009 A | 6/1992 | DeVilbiss | |
| 5,349,309 A * | 9/1994 | Fujii | 331/17 |
| 5,448,193 A | 9/1995 | Baumert et al. | |
| 5,450,572 A | 9/1995 | Ruedinger et al. | |
| 5,519,343 A | 5/1996 | Britz | |
| 5,722,080 A | 2/1998 | Kondo | |
| 5,734,970 A | 3/1998 | Saito | |
| 5,812,618 A | 9/1998 | Muntz et al. | |
| 5,896,427 A | 4/1999 | Muntz et al. | |

(Continued)

FOREIGN PATENT DOCUMENTS

EP    1282279 A2    2/2003

(Continued)

OTHER PUBLICATIONS

PCT International Search Report dated Jun. 6, 2005.

(Continued)

*Primary Examiner*—Chieh M Fan
*Assistant Examiner*—Siu M Lee
(74) *Attorney, Agent, or Firm*—Sawyer Law Group LLP

(57) ABSTRACT

Aspects of providing automatic adaptation to frequency offsets in high speed serial links are described. First signals for phase adjusts in a receiver link are adjusted by detecting trends in the first signals to generate second signals, the second signals improving a rate of compensation for the frequency offsets by the phase adjusts. An up/down counter is included for counting signals for phase adjustments by a clock-data-recovery loop of a serial receiver. An adder is coupled to the up/down counter and outputs accumulated data indicative of a trend in the phase adjustments. Combinatorial logic coupled to the adder adapts the signals based on the accumulated data.

12 Claims, 4 Drawing Sheets

U.S. PATENT DOCUMENTS

| | | |
|---|---|---|
| 5,914,981 A | 6/1999 | Veintimilla |
| 5,943,375 A | 8/1999 | Veintimilla |
| 6,014,512 A | 1/2000 | Mohamed et al. |
| 6,084,932 A | 7/2000 | Veintimilla |
| 6,188,692 B1 | 2/2001 | Huscroft et al. |
| 6,269,127 B1* | 7/2001 | Richards ............... 375/282 |
| 6,269,128 B1* | 7/2001 | Usui ..................... 375/326 |
| 6,587,521 B1 | 7/2003 | Matui .................... 375/341 |
| 6,615,060 B1* | 9/2003 | Usui ..................... 455/574 |
| 6,959,064 B2* | 10/2005 | Spijker et al. ........... 375/376 |
| 7,075,948 B2* | 7/2006 | Makarov ................ 370/503 |
| 2001/0028266 A1 | 10/2001 | Taniguchi .............. 327/276 |
| 2002/0146084 A1* | 10/2002 | Cranford et al. ......... 375/360 |
| 2004/0208270 A1* | 10/2004 | Schmatz et al. ......... 375/355 |

FOREIGN PATENT DOCUMENTS

| | | |
|---|---|---|
| JP | 5344172 | 12/1993 |
| JP | 09162935 A | 6/1997 |

OTHER PUBLICATIONS

Loop Bandwidth and Clock Data Recovery (CDR) in Oscilloscope Measurements; Application Note 1304-6; Agilent Technologies.

Clock Data Recovery System; IBM DOSS CH920010014.

Clock Data Recovery System with External Early/Late Input; IBM DOSS CH920010044.

New Flexible PLL Solution Simplifies Clock Recovery and Data Retiming, Frequency Translation and Clock Smoothing by Vectron International; Microwave Product Digest, Jun. 2002; http://www.mpdigest.com.

* cited by examiner

| Inputs | | | | Outputs | |
|---|---|---|---|---|---|
| Rot_dn | Rot_up | Underflow | Overflow | Rot_dn' | Rot_up' |
| 0 | 0 | 0 | 0 | 0 | 0 |
| 0 | 0 | 0 | 1 | 0 | 1 |
| 0 | 0 | 1 | 0 | 1 | 0 |
| 0 | 0 | 1 | 1 | 0 | 0 |
| 0 | 1 | 0 | 0 | 0 | 1 |
| 0 | 1 | 0 | 1 | 0 | 1 |
| 0 | 1 | 1 | 0 | 0 | 0 |
| 0 | 1 | 1 | 1 | 0 | 1 |
| 1 | 0 | 0 | 0 | 1 | 0 |
| 1 | 0 | 0 | 1 | 0 | 0 |
| 1 | 0 | 1 | 0 | 1 | 0 |
| 1 | 0 | 1 | 1 | 1 | 0 |
| 1 | 1 | 0 | 0 | 0 | 0 |
| 1 | 1 | 0 | 1 | 0 | 1 |
| 1 | 1 | 1 | 0 | 1 | 0 |
| 1 | 1 | 1 | 1 | 0 | 0 |

Equivalent value of input bits:

| -1 | +1 | +1 | -1 |
|---|---|---|---|

Calculation of outputs:

| true if sum <0 | true if sum >0 |
|---|---|

FIG. 2

C++ Code from system simulation:

```
//now check if the fly wheel is active
if (FlyWheelActive)                                              <- check if fly wheel is switched on
{
    FlyWheelUp[FlyWheelRateCounter] = *OutUp;
    FlyWheelDown[FlyWheelRateCounter] = *OutDown;
    if (++ FlyWheelRateCounter == 4) // FlyWheel runs at 1/16 rate  <- transformation of early/late to quarter rate
    {
        FlyWheelRateCounter = 0; // Reset 0,1,2,3 counter
        // extract the up/down overhang
        Sum = 0;
        for (i=0;i<4;i++)
            Sum += FlyWheelUp[i] - FlyWheelDown[i];
        if (Sum > 0) FlyWheelCounter++;                          <- check for early or late overhang
        if (Sum < 0) FlyWheelCounter--;                          <- step the counter accordingly up or down Div_result = div (FlyWheelCounter,AverageFactor);// average over the 3 LSBs   <- Average over the LSB
        FlyWheelAdder +/= Div_result.quot;                       <- Add the counter MSBs to the accumulator
        Div_result = div (FlyWheelAdder8192);// test for overflow over 2^13   <- Check for positive accumulator overflow
        if (Div_result.quot>= 1)
        {
            *OutUp = false;
            *OutDown = false;
            FlyWheelAdder = Div_result.rem;
            Sum = *OutUp + true = *OutDown - false;
            If (Sum > 0)     *OutUp = true;                      <- Generate an 'up' signal for positive overflow
            If (Sum < 0)     *OutDown = true;
        };
        If (Div_result.quot<=-1)                                 <- Check for negative accumulator overflow
        {
            *OutUp = false;
            *OutDown = false;
            FlyWheelAdder = Div_result.rem;
            Sum = *OutUp + false = *OutDown - true;
            If (Sum > 0)     *OutUp = true;                      <- Generate a 'down' signal for positive overflow
            If (Sum < 0)     *OutDown = true;
        };
    };
};
```

FIG. 3

METHOD FOR PROVIDING AUTOMATIC ADAPTATION TO FREQUENCY OFFSETS IN HIGH SPEED SERIAL LINKS

FIELD OF THE INVENTION

The present invention relates to providing automatic adaptation to frequency offsets in high speed serial links.

BACKGROUND OF THE INVENTION

The ability to perform and achieve high speed transmissions of digital data has become expected in today's computing environment. In most cases, the transmission of digital data over longer distances is accomplished by sending the data in a high-speed serial format (i.e., one single bit after another) over a communication link designed to handle computer communications. In this fashion, data can be transferred from one computer system to another, even if the computer systems are geographically remote.

In order for high-speed serial transmission to occur, the digital data signal from inside the computer must be transformed from the parallel format into a serial format prior to transmission of the data over the serial communication link. This transformation is generally accomplished by processing the computer's internal data signal through a piece of computer equipment known as a serial link transmitter or "serializer." The function of the serializer is to receive a parallel data stream as input and, by manipulating the parallel data stream, output a serial form of the data capable of high-speed transmission over a suitable communication link. Once the serialized data has arrived at the desired destination, a piece of computer equipment known as a "deserializer" is employed to convert the incoming data from the serial format to a parallel format for use within the destination computer system.

For high speed serializer/deserializer (HSS) link pairs, a frequency offset can occur between the frequency of the data coming in and the reference clock. Any frequency offset between the transmitter and receiver of a link pair causes the clock-data-recovery (CDR) loop to chase the optimum sampling point with some delay. The inability to track the offset accurately increases jitter and degrades the link performance, e.g., by increasing the bit error rate.

Accordingly, a need exists for better compensation of frequency offset adjustment in a serial link transmitter/receiver pair. The present invention addresses such a need.

SUMMARY OF THE INVENTION

Aspects of providing automatic adaptation to frequency offsets in high speed serial links are described. First signals for phase adjusts in a receiver link are adjusted by detecting trends in the first signals to generate second signals, the second signals improving a rate of compensation for the frequency offsets by the phase adjusts. An up/down counter is included for counting signals for phase adjustments by a clock-data-recovery loop of a serial receiver. An adder is coupled to the up/down counter and outputs accumulated data indicative of a trend in the phase adjustments. Combinatorial logic coupled to the adder adapts the signals based on the accumulated data.

BRIEF DESCRIPTION OF THE DRAWINGS

FIG. 2 illustrates a logic table for generating new rotate down (Rot_dn') and rotate up (Rot_up') signals by the circuit of FIG. 1.

FIG. 3 illustrates pseudo-code simulating the operation of a quarter-rate version of the circuit of FIG. 1.

DETAILED DESCRIPTION

The present invention relates to providing automatic adaptation to frequency offsets in high speed serial links. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
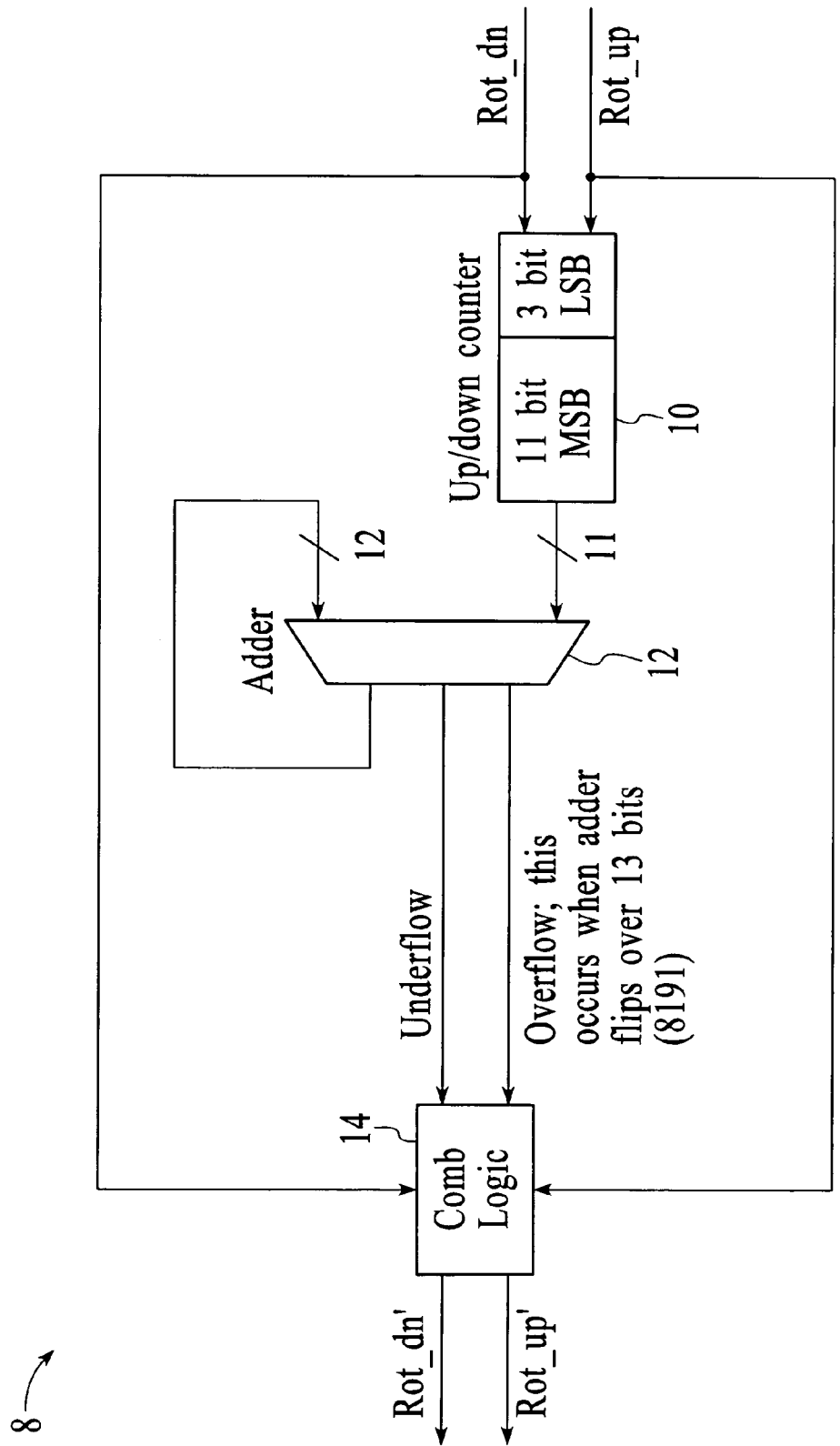
FIG. 1 illustrates a block diagram of an example embodiment of a phase rotator control adjustment circuit of logic components in accordance with the present invention.

Typically, phase rotators are used to adjust the phase based on the frequency offset. The phase rotator receives a rotate up or rotate down signal based on early or late edge detections and then either rotates the phase up or rotates the phase down accordingly. The present invention monitors the rotate up and rotate down signal to determine how well the phase is being monitored. The monitoring information is used to predict a trend of movement in a particular direction by the circuit and cancel out the offset proactively based on the detected trend. FIG. 1 illustrates a block diagram of an example embodiment of a phase rotator control adjustment circuit 8 of logic components to perform the monitoring in accordance with the present invention.

Referring now to FIG. 1, rotate down (Rot_dn) and rotate up (Rot_up) signals from a phase rotator control (not shown) are input into an up/down counter 10. In a preferred embodiment, a chosen number of bits from the input signal are used for averaging, i.e., to determine how big a difference in the ups/downs is seen before the remaining bits of the input signal are added by an accumulator 12. In the example shown, 3 LSBs (least significant bits) of the received data are used for averaging, while 11 MSBs (most significant bits) are accumulated. The underflow and overflow states of the accumulator 12 are input to combinatorial logic 14, along with the Rot_dn and Rot_up signals. From the combinatorial logic 14, new rotate down (Rot_dn') and rotate up (Rot_up') are generated, as indicated by the logic table of FIG. 2.

FIG. 3 illustrates pseudo-code simulating the operation of the circuit of FIG. 1 for a quarter-rate version. As indicated, the process initiates by transforming the active circuitry for quarter-rate operation. A check is then made for early/late difference with a corresponding step in the counter of up or down. The counter data is averaged over the LSBs and the counter MSBs are added to the accumulator. A check of the overflow/underflow status of the accumulator and the rotate up and down signals occurs, as indicated, to generate the new rotate up and down signals as desired. In this manner, the overflow and underflow signals of the accumulator trigger 'blind' phase steps at a constant rate; the rate increases until the up and down inputs are balanced.

Figure 4:
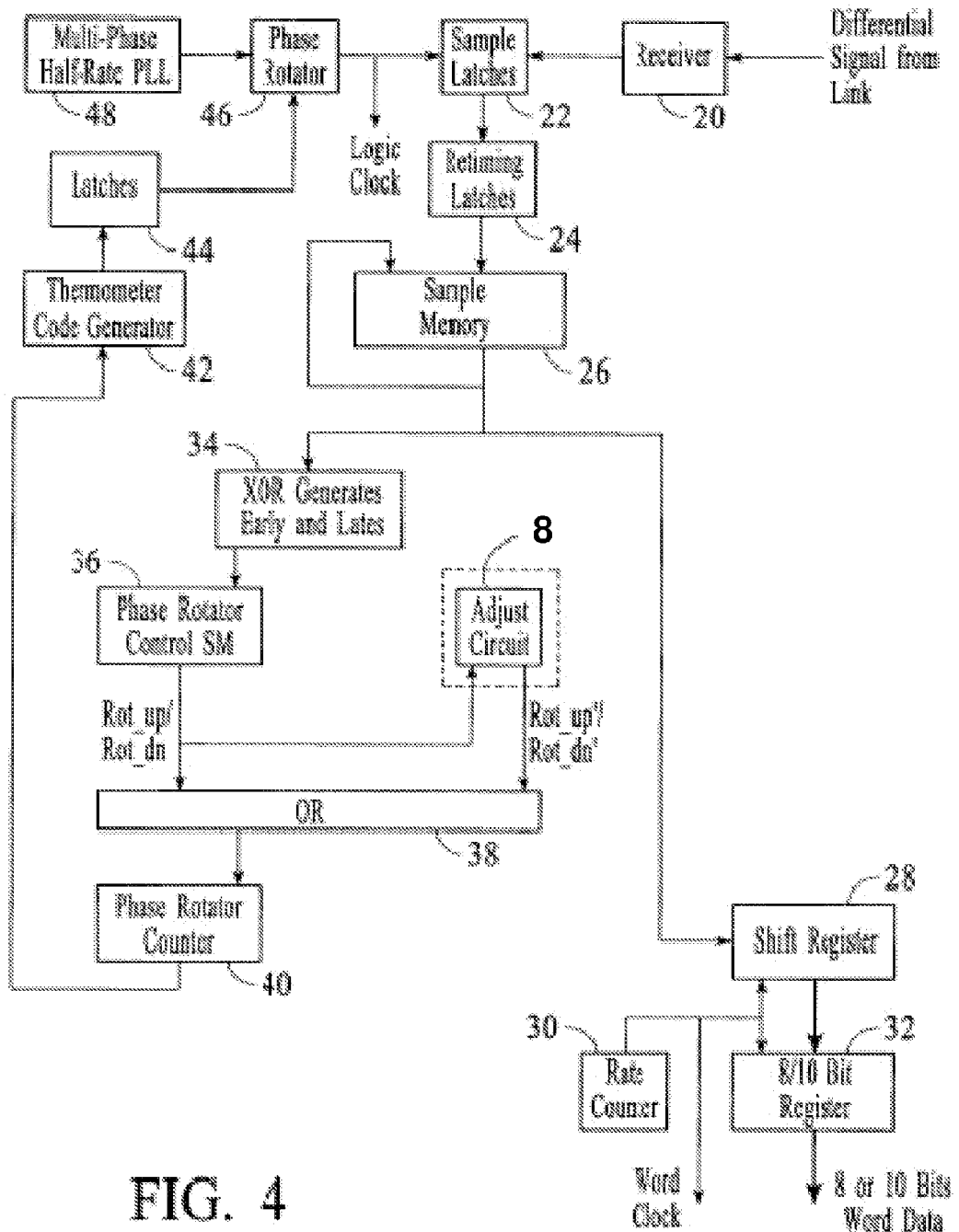
FIG. 4 illustrates a block diagram of a receiver link including the circuit of FIG. 1.

It should be appreciated that the operations of the receiver link occur as is standardly understood with a phase rotator that compensates for frequency offset. However, the resultant Rot_up' and Rot_dn' signals from the phase rotator adjustment circuitry of the present invention reduces jitter and allows handling of much larger offsets when implemented in a receiver link, such as that shown in FIG. 4. Referring to FIG. 4, a differential signal is received in a receiver 20 that passes the data to latches 22 and 24 and then to memory 26. The data from memory 26 is output to a shift register 28 that is coupled to a rate counter 30 and ⅜₁₀bit register 32. The memory 26 is further coupled to XOR (exclusive-OR) logic 34, which is used to generate early and late signals for a phase rotator control 36. The Rot-up and Rot_dn signals from the phase rotator control 36 are passed to an OR gate 38 and to the phase rotator control adjustment circuit 8. The OR gate 38 logically combines the Rot_up and Rot_dn signal from control 36 with the Rot-up' and Rot_dn' from adjustment circuit 8 of the present invention as presented hereinabove and outputs the result to a phase rotator counter 40. As is commonly understood, the counter 40 data passes through a thermometer code generator 42 and latches 44 before being received by a phase rotator 46. A multi-phase half-rate PLL (phase-locked loop) 48 is also coupled to the phase rotator 46. The data from the phase rotator 46 produces a logic clock signal and is fed back to the latches 22, as shown.

Thus, with the inclusion of the present invention in an HSS link, a straightforward enhancement of serial links is achieved that provides an efficient and effective manner of better compensating for frequency offsets. Further, by monitoring the long term trends of phase adjusts created by the clock and data recovery circuit of the serial link, better adaptation of the phase adjustment occurs through creation of future adjusts based on the previous adjusts.

From the foregoing, it will be observed that numerous variations and modifications may be effected without departing from the spirit and scope of the novel concept of the invention. It is to be understood that no limitation with respect to the specific methods and apparatus illustrated herein is intended or should be inferred. It is, of course, intended to cover by the appended claims all such modifications as fall within the scope of the claims.

What is claimed is:

1. A method comprising:
monitoring trends of phase adjusts of signals from a phase rotator control of a clock-data-recovery circuit to a reference clock of a serial receiver, including utilizing an up-down counter and an adder to accumulate phase adjust data from the phase adjusts, wherein the phase adjusts include first rotate up and rotate down signals for phase rotation in the clock-data-recovery circuit; and
adapting the phase adjusts to create future adjusts based on previous adjusts, including utilizing combinatorial logic to generate the future adjusts based on the accumulated phase adjust data and the previous adjusts, wherein the future adjusts include second rotate up and rotate down signals improving a rate of compensation for the frequency offsets by the phase adjusts, and wherein the first rotate up and rotate down signals and the second rotate up and rotate down signals are logically ORed to provide the phase adjusts to the reference clock.

2. The method of claim 1 wherein utilizing the combinatorial logic includes generating the second rotate up signal based on an overflow in the adder.

3. The method of claim 2 wherein utilizing the combinatorial logic includes generating the second rotate down signal based on an underflow in the adder.

4. The method of claim 1 wherein the adder accumulates a chosen number of most significant bits of the up-down counter.

5. A method comprising:
generating first rotate up and rotate down signals for phase adjusts in a receiver link to adapt to frequency offsets, the first rotate up and rotate down signals causing rotation of a phase of a clock signal up or down to compensate for the frequency offsets; and
detecting trends in the first rotate up and rotate down signals using an adjust circuit, and using combinatorial logic to adapt the first rotate up and rotate down signals for the phase adjusts based on accumulated data accumulated by an adder by generating second rotate up and rotate down signals improving a rate of compensation for the frequency offsets by the phase adjusts, the improvement relative to the compensation provided by using only the first rotate up and rotate down signals for adapting to the frequency offsets, and wherein the first rotate up and rotate down signals and the second rotate up and rotate down signals are logically ORed to provide the phase adjusts of the clock signal.

6. The method of claim 5 wherein the detecting trends includes monitoring for an overflow of the first rotate up and rotate down signals.

7. The method of claim 6 wherein the detecting trends includes monitoring for an overflow by counting and accumulating the first rotate up and rotate down signals.

8. The method bf claim 6 wherein the detecting trends includes monitoring for an overflow with an up/down counter coupled to the adder.

9. The method of claim 8 wherein the generating of the second rotate up and rotate down signals includes detection of overflow and underflow in the adder and logically combining the overflow and underflow with the first rotate up and rotate down signals by the combinatorial logic.

10. A method comprising:
using an up/down counter for counting rotate up and rotate down signals from a phase rotator control for phase adjustments by a clock-data-recovery loop of a serial receiver;
using an adder coupled to the up/down counter that outputs accumulated data indicative of a trend in the phase adjustments; and
using combinatorial logic coupled to the adder to adapt the rotate up and rotate down signals based on the accumulated data, wherein the combinatorial logic generates a new rotate up signal based on an overflow in the adder and wherein the combinatorial logic generates a new rotate down signal based on an underflow in the adder.

11. The method of claim 10 wherein the adder accumulates a chosen number of most significant bits of the up/down counter.

12. The method of claim 10 wherein the rotate up and rotate down signals are for phase adjusts in a receiver link to adapt to frequency offsets and causing rotation of a phase of a clock signal up or down to compensate for the frequency offsets, and wherein the new rotate up and rotate down signals improve a rate of compensation for the frequency offsets by the phase adjusts, the improvement relative to the compensation provided by using only the rotate up and rotate down signals for adapting to the frequency offsets, and wherein the rotate up and rotate down signals and the new rotate up and rotate down signals are logically ORed to provide the phase adjusts.

* * * * *